(12) United States Patent
Hurbi et al.

(10) Patent No.: US 10,156,726 B2
(45) Date of Patent: Dec. 18, 2018

(54) GRAPHENE IN OPTICAL SYSTEMS

(71) Applicant: MICROSOFT TECHNOLOGY LICENSING, LLC, Redmond, WA (US)

(72) Inventors: Erin Hurbi, San Francisco, CA (US); Igor Markovsky, Redwood City, CA (US); Michael Nikkhoo, Saratoga, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 8 days.

(21) Appl. No.: 14/754,462

(22) Filed: Jun. 29, 2015

(65) Prior Publication Data

US 2016/0377872 A1 Dec. 29, 2016

(51) Int. Cl.
*G02B 27/01* (2006.01)
*H01L 29/16* (2006.01)
(Continued)

(52) U.S. Cl.
CPC .......... *G02B 27/0176* (2013.01); *B82Y 30/00* (2013.01); *G02B 27/017* (2013.01);
(Continued)

(58) Field of Classification Search
CPC ............ G02B 27/0018; G02B 27/0093; G02B 27/01; G02B 27/0101; G02B 27/0103;
(Continued)

(56) References Cited

U.S. PATENT DOCUMENTS

2011/0030991 A1 2/2011 Veerasamy et al.
2012/0241069 A1 9/2012 Hofmann et al.
(Continued)

FOREIGN PATENT DOCUMENTS

CN 103389846 A 11/2013
KR 200460258 Y1 5/2012
(Continued)

OTHER PUBLICATIONS

Bourzac, Katherine, "Contact Lens Computer: Like Google Glass, without the Glasses", Published on: Jun. 7, 2013, Available at: http://www.technologyreview.com/news/515666/contact-lens-computer-like-google-glass-without-the-glasses/.
(Continued)

*Primary Examiner* — Thomas K Pham
*Assistant Examiner* — Ibrahima Diedhiou
(74) *Attorney, Agent, or Firm* — Alleman Hall Creasman & Tuttle LLP

(57) ABSTRACT

The examples disclosed herein are related to graphene-based materials on see-through optical displays. One example provides, a computing device, including a see-through display system including an optical component through which a surrounding environment is viewable, an electrical component disposed on a user-facing side of the optical component, and a graphene-based layer disposed on the optical component, the graphene-based layer comprising a greater thickness of a graphene-based material on a portion closer to the electrical component and a lesser thickness of a graphene-based material on a portion farther from the electrical component.

19 Claims, 4 Drawing Sheets

(51) Int. Cl.
*H01L 23/552* (2006.01)
*B82Y 30/00* (2011.01)
*B82Y 20/00* (2011.01)

(52) U.S. Cl.
CPC ........ *G02B 27/0172* (2013.01); *H01L 23/552* (2013.01); *H01L 29/1606* (2013.01); *B82Y 20/00* (2013.01); *G02B 2027/0161* (2013.01); *G02B 2027/0194* (2013.01)

(58) Field of Classification Search
CPC .............. G02B 27/0149; G02B 27/017; G02B 27/0172; G02B 27/0176; G02B 27/0179; G02B 27/0189; G02B 27/0977; G02B 27/0983; G02B 27/22; G02B 27/225; G02B 27/2292; G02B 2027/0105; G02B 2027/0107; G02B 2027/0109; G02B 2027/011; G02B 2027/0112; G02B 2027/0114; G02B 2027/116; G02B 2027/0118; G02B 2027/012; G02B 2027/0121; G02B 2027/0123; G02B 2027/0125; G02B 2027/0127; G02B 2027/0129; G02B 2027/013; G02B 2027/0132; G02B 2027/0134; G02B 2027/0136; G02B 2027/0138; G02B 2027/014; G02B 2027/0141; G02B 2027/0143; G02B 2027/0145; G02B 27/0147; G02B 27/015; G02B 27/0152; G02B 27/0154; G02B 27/0156; G02B 27/0158; G02B 27/0163; G02B 27/0165; G02B 27/0167; G02B 27/0169; G02B 27/0174; G02B 27/0181; G02B 27/0183; G02B 27/0185; G02B 27/0187; G02B 27/019; G02B 27/0192; G02B 27/0194; G02B 27/016; G02B 27/0198; G02B 1/105; G02B 1/12; G02B 1/14; G02B 6/0085; G02B 7/008; G06F 1/20; G06F 1/163; G06F 3/011; G06F 3/012; G06F 3/005; G06F 3/0346; G06F 3/04815; G06F 3/1431; G06F 1/1616; G06F 1/1681; G06F 17/30061; G06F 2203/04802; Y10T 16/538; Y10T 16/53815; Y10T 428/24802; Y10T 428/2495; Y10T 428/265; F28F 21/00; F28F 21/02; F28F 3/02; F28F 3/022; H01L 23/373; H01L 29/1606; H01L 29/66015; H01L 2924/13088; H01L 2023/4068; G02C 11/08; G02C 11/10; G02C 5/00; G02C 11/00; H05K 7/20127; H05K 7/2039; H05K 7/20409; H05K 7/20418; H05K 7/20436; H05K 7/20454; H05K 7/20481; H05K 7/20963; H01M 10/65; G03B 21/2066; G03B 21/28; G03B 31/08; C23C 16/26; C01B 31/04; C01B 31/0438; C01B 31/0453; C01B 31/0461; C01B 31/0484; C01B 2204/00; C01B 2204/02; C01B 2204/04; C01B 2204/06; C01B 2204/065; C01B 2204/20; C01B 2204/22; C01B 2204/24; B29D 12/02; B29D 11/00596; B29K 2507/04; B29K 2707/04; B29K 2995/0013; B29L 2012/005; B29L 2031/3475; H04N 1/00408; H04N 1/00411; H04N 1/00413; H04N 1/00416; H04N 1/00501; H04N 1/2125; H04N 5/23216; H04N 5/23238; H04N 5/2621; H04N 5/2622; H04N 5/2624; H04N 5/2625; H04N 5/2627; H04N 5/2628; H04N 5/265; H04N 5/268; H04N 5/272; H04N 5/2723; H04N 5/275; H04N 5/278; H04N 7/157; H04N 9/74; H04N 9/75; H04N 9/76; H04N 13/00; H04N 13/0003; H04N 13/0007; H04N 13/0018; H04N 13/0022; H04N 13/0044; H04N 13/0275; H04N 13/0278; H04N 13/0402; H04N 2005/2726; H04N 2201/3256; H04N 2213/003; B82Y 40/00; G06T 3/4038; G06T 7/0046; G06T 11/60; G06T 15/00; G06T 15/06; G06T 15/20; G06T 15/40; G06T 15/50; G06T 15/503; G06T 17/00; G06T 17/10; G06T 17/20; G06T 19/00; G06T 19/006; G06T 2200/04; G06T 2200/08; G06T 2207/20212; G06T 2207/20221; G06K 9/00248; G06K 9/00671; G08B 13/19678; G08B 13/1968; G08B 13/19683; G09G 1/007; G09G 3/00; G09G 3/003; G09G 5/377; G09G 2340/10; G09G 2340/12; G09G 2340/125; G09G 2370/022; G11B 27/036; G11B 27/038; H04M 1/0214; H04M 1/0216; H04M 1/0218; H04M 1/022; H04M 1/0222; A61B 6/466; A61B 8/466; A63F 13/00; A63F 13/005; A63F 13/02; A63F 13/06; A63F 13/08; A63F 13/12; A63F 2300/66; A63F 2300/6607; A63F 2300/6615; A63F 2300/6623; A63F 2300/663; A63F 2300/6638; A63F 2300/6646; A63F 2300/6653; A63F 2300/6661; A63F 2300/6669; A63F 2300/6676; A63F 2300/6684; A63F 2300/6692; G01C 21/3635; G01C 21/3638; F28D 15/00
USPC ......... 359/580, 597, 630–633; 345/7–8, 156, 345/204, 419, 629, 630, 632–633; 348/239, 333.02; 353/28, 99; 423/448; 427/249.1; 428/195.1, 213, 336; 715/757; 977/700, 734, 891; 16/277, 16/285–286

See application file for complete search history.

(56) References Cited

U.S. PATENT DOCUMENTS

| | | |
|---|---|---|
| 2013/0027778 A1 | 1/2013 | Currie et al. |
| 2013/0065034 A1 | 3/2013 | Muramatsu |
| 2013/0087705 A1 | 4/2013 | Hiura et al. |
| 2013/0136966 A1 | 5/2013 | Bhardwaj |
| 2013/0143048 A1 | 6/2013 | Kim et al. |
| 2013/0334410 A1 | 12/2013 | Sutter et al. |
| 2014/0124176 A1 | 5/2014 | Zhamu et al. |
| 2014/0199542 A1 | 7/2014 | Li et al. |
| 2014/0225235 A1* | 8/2014 | Du ........................ H01L 23/373 257/659 |
| 2014/0361988 A1* | 12/2014 | Katz ..................... G06F 3/011 345/156 |
| 2015/0177521 A1* | 6/2015 | Abdollahi ............ G02B 27/017 345/8 |
| 2016/0174369 A1* | 6/2016 | Safai ..................... B64C 1/061 362/382 |

FOREIGN PATENT DOCUMENTS

| | | | |
|---|---|---|---|
| WO | 8802494 A1 | 4/1988 | |
| WO | WO 8802494 A1 * | 4/1988 | ............. G01S 13/60 |
| WO | 2011042327 A1 | 4/2011 | |

(56) References Cited

FOREIGN PATENT DOCUMENTS

| WO | 2013172792 A1 | 11/2013 |
| WO | 2013185224 A1 | 12/2013 |
| WO | 2014004514 A1 | 1/2014 |

OTHER PUBLICATIONS

"Graphene", Wikipedia Website, Available Online at https://en.wikipedia.org/w/index.php?title=Graphene&oldid=621692371, As Retrieved Aug. 17, 2014, 36 pages.

ISA European Patent Office, International Search Report and Written Opinion Issued in Application No. PCT/US2016/037462, dated Sep. 8, 2016, WIPO, 13 Pages.

IPEA European Patent Office, Second Written Opinion Issued in PCT Application No. PCT/US2016/037462, dated May 18, 2017, WIPO, 6 pages.

"International Preliminary Report on Patentability Issued in PCT Application No. PCT/US2016/037462", dated Oct. 11, 2017, 8 Pages.

* cited by examiner

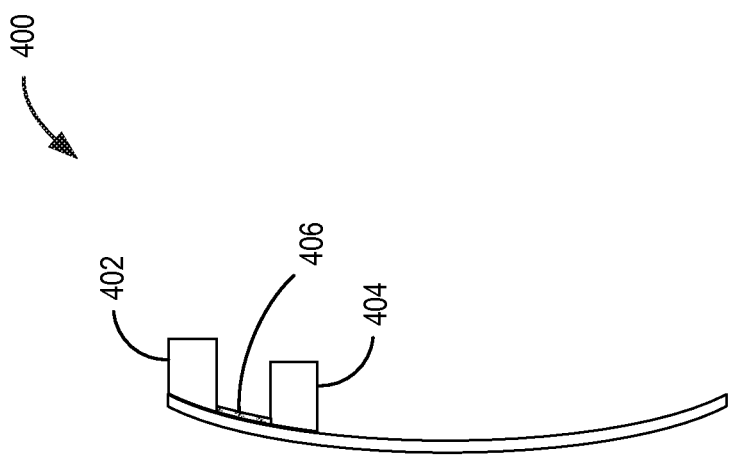

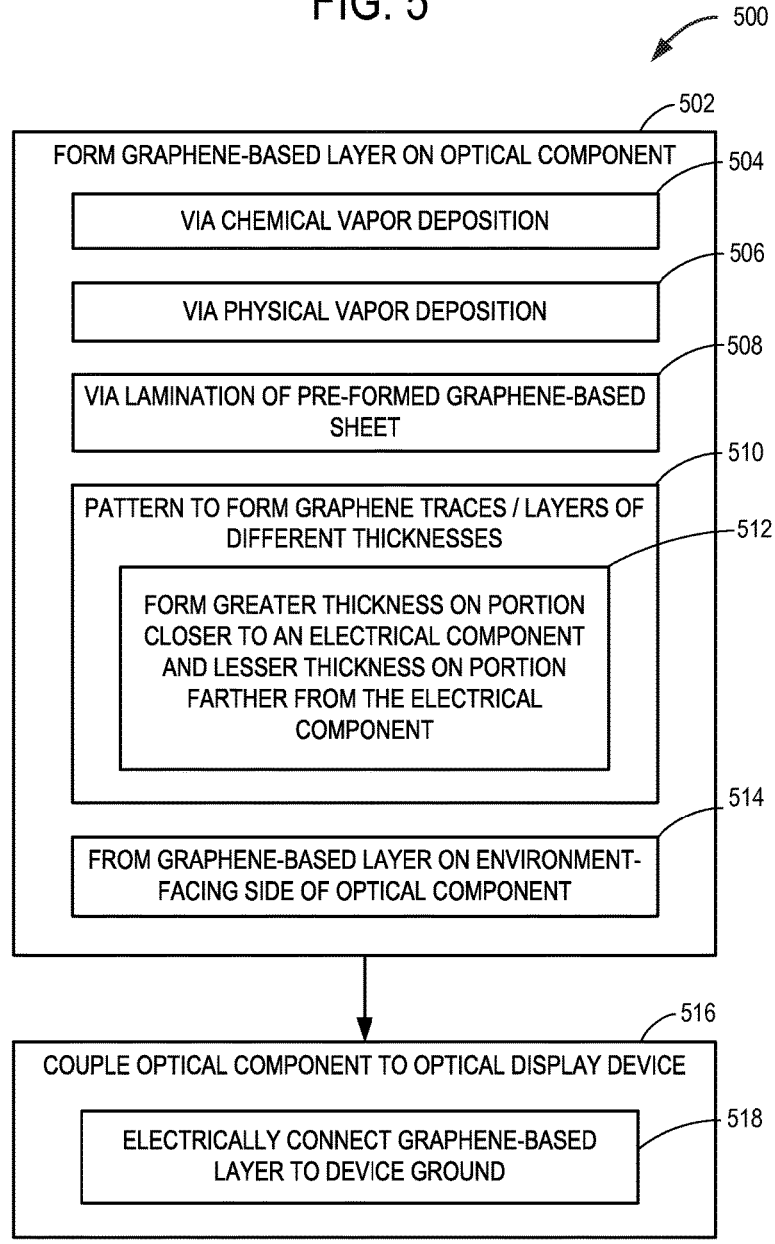

GRAPHENE IN OPTICAL SYSTEMS

BACKGROUND

A see-through display device may be configured to display near-eye imagery to a user for an immersive virtual or augmented reality experience. Some see-through display devices, such as some head-mounted display devices, may be configured to incorporate electrical and optical systems used to present imagery into a fully integrated wearable device.

SUMMARY

Examples disclosed herein relate to the use of graphene-based layers on optical components in see-through display systems. One example provides a computing device comprising a see-through display system including an optical component through which a surrounding environment is viewable, an electrical component disposed on a user-facing side of the optical component, and a graphene-based layer disposed on the optical component, the graphene-based layer comprising a greater thickness of a graphene-based material on a portion closer to the electrical component and a lesser thickness of the graphene-based material on a portion farther from the electric component.

Another example provides a computing device comprising a see-through display system including an optical component through which a surrounding environment is viewable, an electrical component disposed on the device adjacent a user-facing side of the optical component, and a graphene-based layer disposed on an environment-facing side of the optical component, the graphene-based layer being electrically connected to a device ground.

Yet another example provides a computing device comprising a see-through display system including an optical component through which a surrounding environment is viewable, a first electrical component disposed on a user-facing side of the optical component, a second electrical component disposed on the user-facing side of the optical component, and a graphene-based trace formed on the optical component and electrically connecting the first electrical component and the second electrical component.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4 shows a sectional view illustrating an example graphene-based trace electrically connecting electrical components mounted on a see-through optical component.

FIG. 5 shows a flow diagram illustrating an example method of incorporating graphene-based layers into an optical display device.

DETAILED DESCRIPTION

A head-mounted display device may utilize various electrical components, such as processors and other logic components, that at times output potentially significant amounts of heat. This heat can impact user comfort if not dissipated efficiently. However, structures for efficiently dissipating heat may be bulky and heavy, and thus impact comfort and wearability.

Accordingly, examples are disclosed herein that relate to the use of layers of graphene-based materials in see-through display devices. Briefly, graphene is an allotrope of carbon comprising a single-layered sheet (an atomic monolayer) of hexagonal rings of carbon atoms. Graphene has high thermal and electrical conductivities along the plane of the sheet, thereby allowing graphene to be used in both electrically and thermally conductive roles in a device. For example, as described in more detail below, a layer of a graphene-based material may be formed on a see-through optical component for use as an electromagnetic interference shield and/or circuit trace, as well as for a heat spreader.

Layers of graphene-based materials as described herein may comprise one or more monolayers of graphene, and may be formed in various manners. For example, monolayer or multilayer films of graphene may be formed via various thin film deposition technologies, including but not limited chemical vapor deposition (CVD) and physical vapor deposition (PVD) techniques. Some CVD deposition methods may utilize relatively high substrate temperatures for deposition, and as such may not be suitable for use with some substrates. On the other hand, some PVD techniques may allow the use of lower substrate temperatures to deposit graphene layers, and thus may be used with such substrates. It will be understood that any other suitable technique may be used to form a graphene layer.

Graphene also may be incorporated into a see-through display device for its optical properties. For example, as a monolayer of graphene may absorb approximately 2.8% of incident light, a layer of a graphene-based material of controlled thickness may be used to selectively control a transparency of a see-through optical component, such that a thicker portion may be used to hide components located behind a portion of an otherwise transparent optical component, while a thinner portion may be used to permit a user to see through another portion of the optical component.

Figure 1:
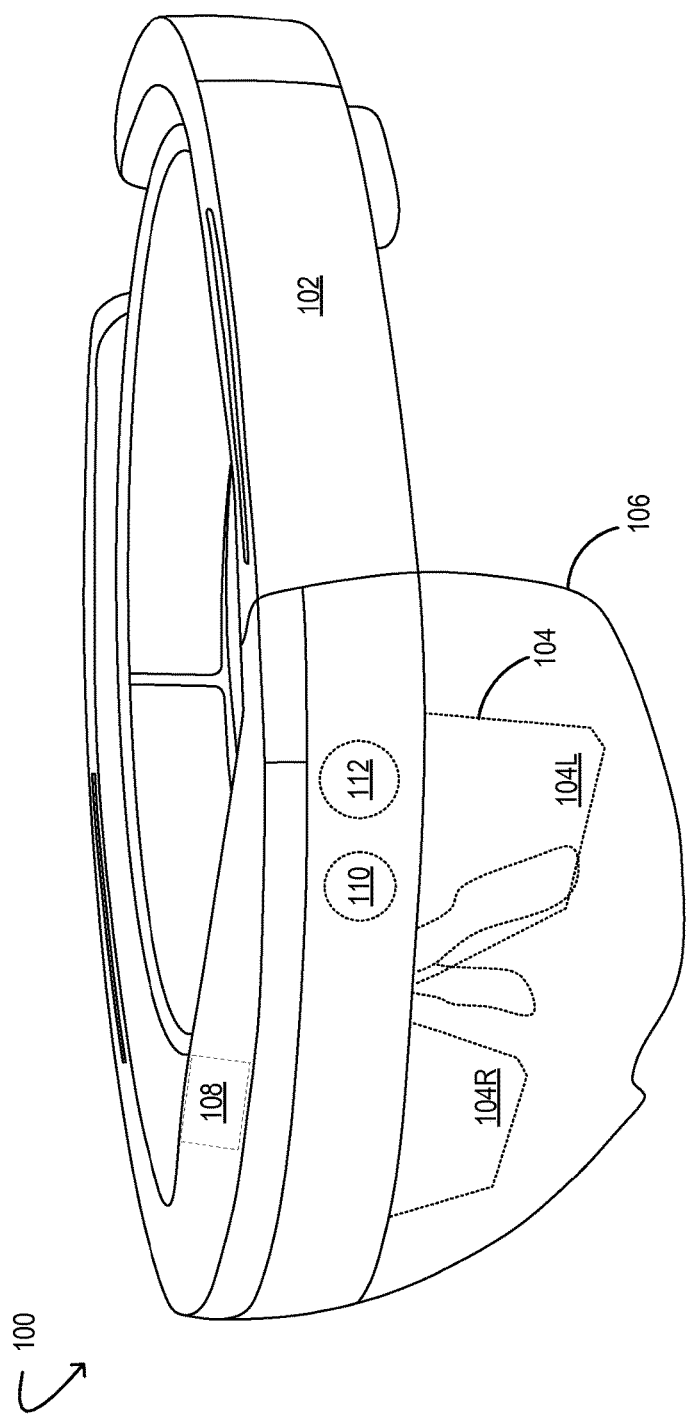
FIG. 1 shows an example head-mounted display device.

FIG. 1 shows aspects of an example head-mounted display device 100. The head-mounted display device 100 includes a frame 102 in the form of a band wearable around a head of user that supports see-through display componentry positioned nearby the user's eyes. As mentioned above, the head-mounted display device 100 may utilize augmented reality technologies to enable simultaneous viewing of virtual display imagery and a real world background. As such, the display device 100 may generate virtual images via see-through display 104, which includes separate right and left eye displays 104R and 104L, and which may be wholly or partially transparent. The see-through display 104 may take any suitable form, such as a waveguide or prism configured to receive a generated image and direct the image towards a wearer's eye. The see-through display 104 may include a backlight and a microdisplay, such as liquid-crystal display (LCD) or liquid crystal on silicon (LCOS) display, in combination with one or more light-emitting diodes (LEDs), laser diodes, and/or other light sources. In other examples, the see-through display 104 may utilize quantum-dot display technologies, active-matrix organic LED (OLED) technology, and/or any other suitable display technologies. It will be understood that while shown in FIG. 1 as a flat display surface with left and right eye displays, the see-through display 104 may be a single display, may be curved, or may take any other suitable form.

The head-mounted display device 100 further includes an additional see-through optical component 106, shown in FIG. 1 in the form of a see-through veil positioned between the see-through display 104 and the background environment as viewed by a wearer. A controller 108 is operatively coupled to the see-through optical component 104 and to other display componentry. The controller 108 includes one or more logic devices and one or more computer memory devices storing instructions executable by the logic device(s) to enact functionalities of the display device. The display device 100 may further include various other components, for example a two-dimensional image camera 110 (e.g. a visible light camera and/or infrared camera) and a depth camera 112, as well as other components that are not shown, including but not limited to speakers, microphones, accelerometers, gyroscopes, magnetometers, temperature sensors, touch sensors, biometric sensors, other image sensors, eye-gaze detection systems, energy-storage components (e.g. battery), a communication facility, a GPS receiver, etc.

Figure 2:
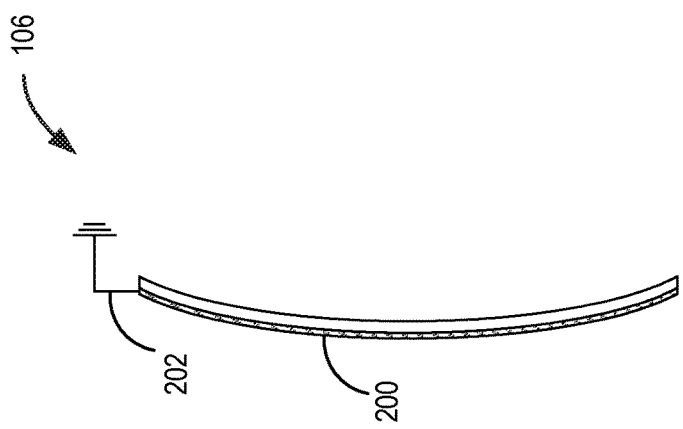
FIG. 2 shows a sectional view schematically illustrating an example of a graphene-based layer on a see-through optical component.

FIG. 2 shows a schematic illustration of an example cross-sectional view of the optical component 106, and illustrates an example layer 200 of a graphene-based material. In the example of FIG. 2, the layer 200 of the graphene-based material is located on an environment-facing surface of the optical component 106. In other examples, the layer 200 may be located on a user-facing surface of the optical component 106. As graphene-based materials are electrically conductive, the layer 200 may be used as an electromagnetic shield by connecting the layer 200 to a device ground, as shown at 202.

The layer 200 of the graphene-based material may be formed on the optical component 106 in any suitable manner. For example, depending upon the material used for the optical component 106, the layer of the graphene-based material may be formed via a thin film deposition technique, such as a CVD or PVD technique. In other examples, a pre-formed sheet of a graphene-based material may be laminated to the optical component 106.

Electrical components and other hardware may be incorporated in the head-mounted display device 100 at locations potentially visible through the see-through optical component 106, in the absence of some sort of visual shielding. For example, in FIG. 1, electrical componentry associated with the image sensors 110, 112, and other electrical hardware located along a front of the head-mounted display device 100 may be located immediately behind via the see-through optical component 106, and even mounted on the see-through optical component 106. Thus, a layer of a graphene-based material may be used to hide these components from view.

Figure 3:
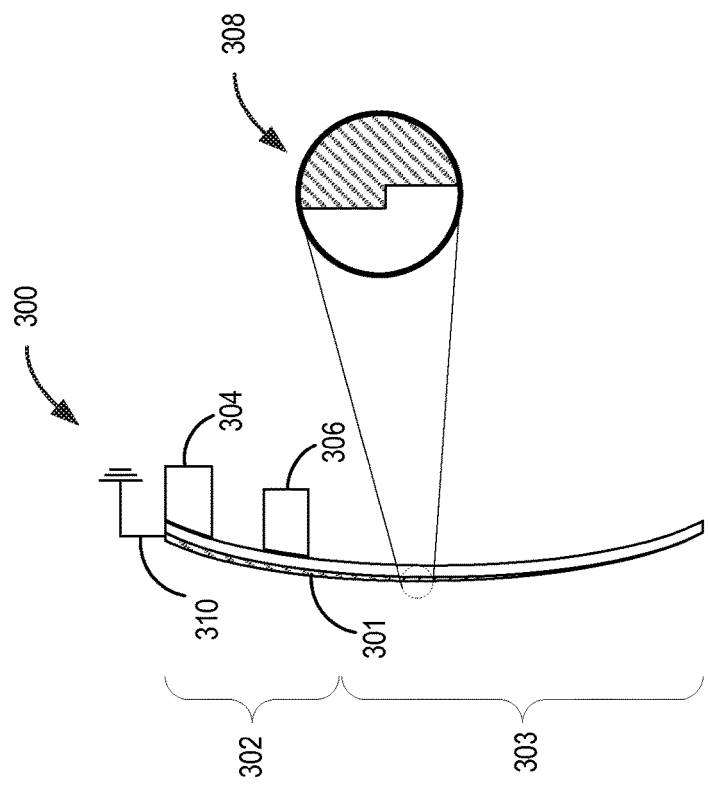
FIG. 3 shows a sectional view schematically illustrating an example graphene-based layer having a gradient of thicknesses.

FIG. 3 schematically illustrates the see-through optical component 106 having a layer of a graphene-based material 301 with a first region 302 of a greater thickness of the graphene-based material and second region 303 of a lesser thickness of the graphene-based material. In this manner, the layer of the graphene-based material may have regions of different thicknesses to hide components 304 and 306 (via region 302) from view while allowing a user to view a real-world background (via region 303). A magnified view 308 schematically illustrates a step in thickness formed between region 302 and region 303, illustrating the differences in layer thicknesses. Such a step may be formed from a masking process. In some examples, multiple patterning steps may be used to form a gradient of graphene-based layers across a dimension (e.g. top to bottom in the orientation of FIG. 1) of the optical component 106.

Each region 302 and 303 may have any suitable thickness to provide for desired optical transparency or opacity. Further, the thickness of each region 302 and 303 may be controlled in any suitable manner. For example, in implementations in which a CVD or PVD process is used to deposit the layer of graphene-based material, a thickness of the deposited layer may be controlled by controlling deposition time and conditions. Further, as mentioned above, masking may be used to selectively apply different thicknesses of graphene-based material on different portions of the see-through optical component 106. A thickness of a layer applied may be dependent upon a number of process patterning/deposition cycles used to form the layer, as well as on deposition conditions. Similarly, in the case of a laminated graphene-based layer, different numbers of sheets may be laminated to different regions of the optical component to form areas of differing opacity. In this manner, a region of the optical component 106 that is positioned adjacent structures to be hidden may be made relatively more opaque, and a region through which a user views a real-world background may be made relatively less opaque, or may omit a layer of a graphene-based material entirely.

As mentioned above, a layer of a graphene-based material may serve as a heat spreading element to help direct heat away from the heat-generating electrical components. This may help to prevent thermal expansion and/or warpage of the see-through optical component 106 over time. For example, where components 304 and 306 are heat-producing electrical components, in the absence of a heat spreading coating formed on the optical component 106, repeated localized heating around the components 304 and 306 may lead to warping of the optical component 106. Thus, the use of a layer of a graphene-based material on the optical component 106 may help such heat spread widely across the surface of the optical component. This may help dissipate heat more quickly and thus lower device temperatures, and thus may help to reduce any risk of warpage. Such a graphene-based layer also may be connected to a device ground 310, and thus may have multiple functionalities. It will be understood that, in other examples, a layer of a graphene-based material may alternatively or additionally be disposed on a user-facing side of the surface of a see-through optical component.

Graphene-based materials also may be used as traces on a surface of the optical component 106 to electrically connect device components. FIG. 4 shows a cross-sectional view of the see-through optical component 400, where two electrical components 402 and 404 are electrically connected by a graphene-based trace 406 formed on a user-facing surface of the optical component. Graphene-based traces may be nearly transparent depending upon how many monolayers of graphene are used to form the trace. This may allow for the formation of near-transparent circuitry, which may allow the circuitry to be positioned in a user's field of view in some examples. It will be understood that graphene-based traces may be formed to connect any suitable number of electrical components located at any suitable positions on the see-through optical component 106.

Graphene-based materials thus may serve as lightweight and multi-functional materials in a wearable display device.

Although disclosed herein in the context of a head-mounted display device, it will be understood that graphene-based materials may be similarly incorporated into any other suitable display device, including but not limited to virtual reality head-mounted display devices and other wearable display devices.

FIG. 5 shows a flow diagram illustrating an example method 500 of making an optical display device. Method 500 includes, at 502, forming a layer of a graphene-based material on an optical component of the device. The layer of the graphene-based material may be formed in any suitable manner, including but not limited to via CVD techniques 504, PVD techniques 506, and/or lamination utilizing a pre-formed sheet of a graphene-based material 508.

Forming the layer of the graphene-based material on the see-through optical component further may comprise patterning the layer at 510 to form graphene-based traces and/or layers of different thicknesses. This may include, for example, forming greater thickness of the graphene-based material on a portion closer to an electrical component mounted on the optical component, and a lesser thickness of the graphene-based material on a portion farther away from the electrical component, as shown at 512. The graphene-based layer may take any suitable form, including but not limited to a uniform layer, a partial layer, a smooth gradient of layers, and a step-wise gradient of layers. The graphene-based layer may be formed on an environment-facing side of the optical component, as shown at 514, and/or on a user-facing side.

Method 500 further includes, at 516, coupling the optical component to the display device. Where the layer of the graphene-based material acts as an EMI shield, this may include, at 518, electrically connecting the graphene-based layer to a device ground.

Another example provides a computing device comprising a see-through display system including an optical component through which a surrounding environment is viewable, an electrical component disposed on a user-facing side of the optical component, and a graphene-based layer disposed on the optical component, the graphene-based layer comprising a greater thickness of a graphene-based material on a portion closer to the electrical component and a lesser thickness of the graphene-based material on a portion farther from the electrical component. The optical component may additionally or alternatively include a see-through veil placed between a see-through display and a background environment. The graphene-based layer may additionally or alternatively be electrically connected to a device ground. The computing device may additionally or alternatively include a thermal path connecting the graphene-based layer to the electrical component. The graphene-based layer may additionally or alternatively be disposed on an environment-facing side of the optical component opposite the user-facing side. Additionally or alternatively, wherein the electrical component is a first electrical component, the computing device may include a second electrical component and a graphene-based conductive trace formed on the optical component and electrically connecting the first electrical component and the second electrical component. The computing device may additionally or alternatively be a head-mounted display device.

Another example provides a computing device comprising a see-through display system including an optical component through which a surrounding environment is viewable, an electrical component disposed on the device adjacent a user-facing side of the optical component, and a graphene-based layer disposed on an environment-facing side of the optical component, the graphene-based layer being electrically connected to a device ground. The electrical component may additionally or alternatively be disposed on the user-facing side of the optical component. The optical component may additionally or alternatively include a see-through veil. The graphene-based layer may additionally or alternatively include a greater thickness of a graphene-based material on a portion closer to the electrical component and a lesser thickness of the graphene-based material on a portion farther from the electrical component. The computing device may additionally or alternatively be a head-mounted display device. The computing device may additionally or alternatively include a thermal path connecting the graphene-based layer to the electrical component. Additionally or alternatively, wherein the electrical component is a first electrical component, the computing device may include a second electrical component and a graphene-based trace formed on the optical component and electrically connecting the first electrical component and the second electrical component.

Another example provides computing device comprising a see-through display system including an optical component through which a surrounding environment is viewable, a first electrical component disposed on a user-facing side of the optical component, a second electrical component disposed on the user-facing side of the optical component, and a graphene-based trace disposed on the optical component and electrically connecting the first electrical component and the second electrical component. The computing device may additionally or alternatively include a graphene-based layer disposed on an environment-facing side opposite the user-facing side of the optical component. The graphene-based layer may additionally or alternatively be electrically connected to a device ground. The graphene-based layer may additionally or alternatively include a greater thickness of a graphene-based material on a portion closer to the first electrical component and the second electrical component and a lesser thickness of the graphene-based material on a portion farther from the first electrical component and the second electrical component. The computing device may additionally or alternatively include a thermal path connecting the graphene-based layer to each of the first electrical component and the second electrical component. The computing device may additionally or alternatively be a head-mounted display device.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:
1. A computing device, comprising:
a see-through display system including an optical component through which a surrounding environment is viewable;

an electrical component disposed on a user-facing side of the optical component; and a graphene-based layer disposed on the optical component, the graphene-based layer comprising a greater thickness of a graphene-based material on a portion closer to the electrical component and a lesser thickness of the graphene-based material on a portion farther from the electrical component.

2. The computing device of claim 1, wherein the optical component comprises a see-through veil placed between a see-through display and a background environment.

3. The computing device of claim 1, wherein the graphene-based layer is electrically connected to a device ground.

4. The computing device of claim 1, further comprising a thermal path connecting the graphene-based layer to the electrical component.

5. The computing device of claim 1, wherein the graphene-based layer is disposed on an environment-facing side of the optical component opposite the user-facing side.

6. The computing device of claim 1, wherein the electrical component is a first electrical component, and wherein the computing device further comprises a second electrical component and a graphene-based conductive trace formed on the optical component and electrically connecting the first electrical component and the second electrical component.

7. The computing device of claim 1, wherein the computing device comprises a head-mounted display device.

8. A computing device, comprising:
a see-through display system including an optical component through which a surrounding environment is viewable;
an electrical component disposed on the device adjacent a user-facing side of the optical component; and
a graphene-based layer disposed on an environment-facing side of the optical component, the graphene-based layer being electrically connected to a device ground, wherein the graphene-based layer comprises a greater thickness of a graphene-based material on a portion closer to the electrical component and a lesser thickness of the graphene-based material on a portion farther from the electrical component.

9. The computing device of claim 8, wherein the electrical component is disposed on the user-facing side of the optical component.

10. The computing device of claim 8, wherein the optical component comprises a see-through veil.

11. The computing device of claim 8, wherein the computing device comprises a head-mounted display device.

12. The computing device of claim 8, further comprising a thermal path connecting the graphene-based layer to the electrical component.

13. The computing device of claim 8, wherein the electrical component is a first electrical component, and wherein the computing device further comprises a second electrical component and a graphene-based trace formed on the optical component and electrically connecting the first electrical component and the second electrical component.

14. A computing device, comprising:
a see-through display system including an optical component through which a surrounding environment is viewable;
a first electrical component disposed on a user-facing side of the optical component;
a second electrical component disposed on the user-facing side of the optical component;
a graphene-based trace disposed on the optical component and electrically connecting the first electrical component and the second electrical component; and
a graphene-based layer disposed on the optical component, the graphene-based layer comprising a gradient of thicknesses across a dimension of the optical component.

15. The computing device of claim 14, wherein the graphene-based layer is disposed on an environment-facing side opposite the user-facing side of the optical component.

16. The computing device of claim 15, wherein the graphene-based layer is electrically connected to a device ground.

17. The computing device of claim 15, wherein the graphene-based layer comprises a greater thickness of a graphene-based material on a portion closer to the first electrical component and the second electrical component and a lesser thickness of the graphene-based material on a portion farther from the first electrical component and the second electrical component.

18. The computing device of claim 15, further comprising a thermal path connecting the graphene-based layer to each of the first electrical component and the second electrical component.

19. The computing device of claim 14, wherein the computing device comprises a head-mounted display device.

* * * * *